United States Patent [19]
Trowbridge et al.

[11] Patent Number: 5,939,791
[45] Date of Patent: Aug. 17, 1999

[54] ELECTRICALLY CONDUCTIVE INTERCONNECTS FOR INTEGRATED CIRCUITS

[75] Inventors: Teresa A. Trowbridge, Los Altos; Calvin T. Gabriel, Cupertino, both of Calif.

[73] Assignee: VLSI Technology, Inc., San Jose, Calif.

[21] Appl. No.: 08/579,172

[22] Filed: Dec. 27, 1995

[51] Int. Cl.⁶ .................................................. H01L 29/78
[52] U.S. Cl. .................... 257/775; 257/773; 257/776; 257/741; 257/751; 257/734; 257/665
[58] Field of Search .................................. 257/775, 773, 257/776, 741, 751, 734, 665; 438/638, 639

[56] References Cited

U.S. PATENT DOCUMENTS

| | | | |
|---|---|---|---|
| 5,040,036 | 8/1991 | Hazani | 357/23.5 |
| 5,115,288 | 5/1992 | Manley | 357/23.5 |
| 5,267,194 | 11/1993 | Jang | 365/185 |
| 5,422,504 | 6/1995 | Chang et al. | 257/316 |

*Primary Examiner*—Viet Q. Nguyen
*Attorney, Agent, or Firm*—Majestic, Parsons, Siebert & Hsue P.C.

[57] ABSTRACT

A sharp transition or step is first formed on the surface of a semiconductor material. A layer of interconnect metal is deposited by conformal CVD and substantially the same thickness of the metal as deposited is removed by anisotropic etching, leaving a narrow line of the interconnect metal at the step portion to serve as an interconnect line. Interconnect lines of 0.5 micron or below can be achieved since the process is not limited by photostepper resolution.

19 Claims, 4 Drawing Sheets

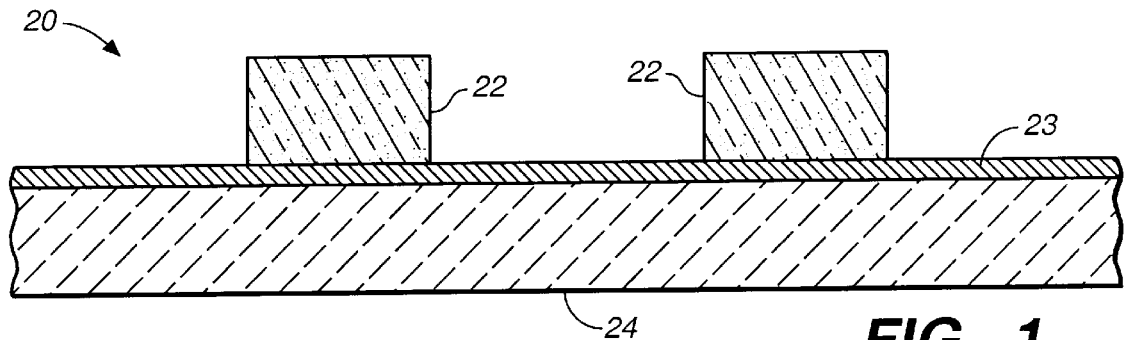
FIG._1
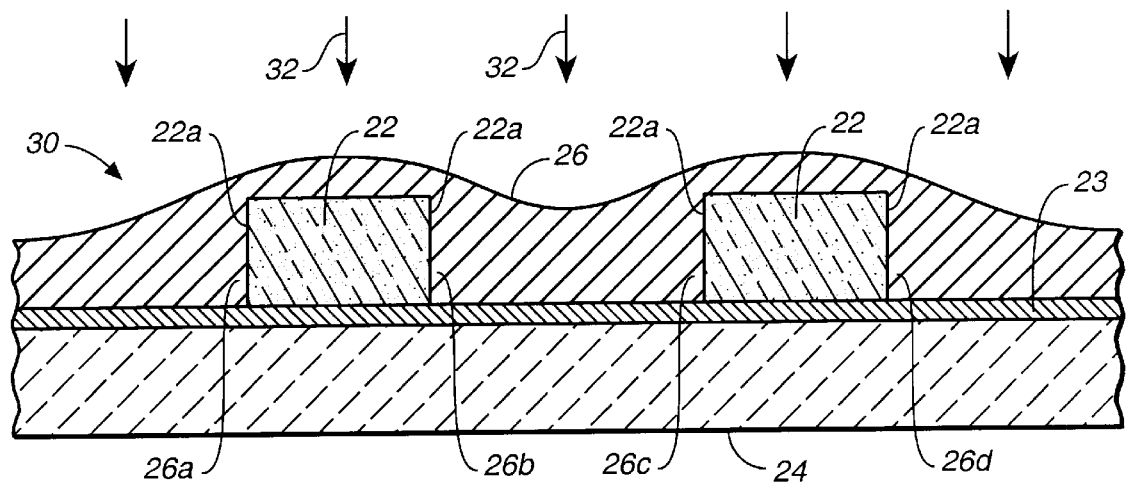
FIG._2
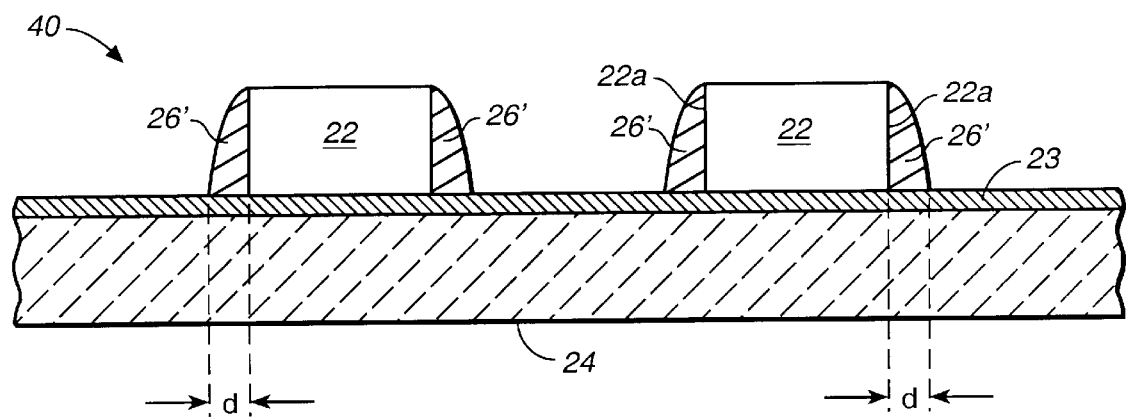
FIG._3

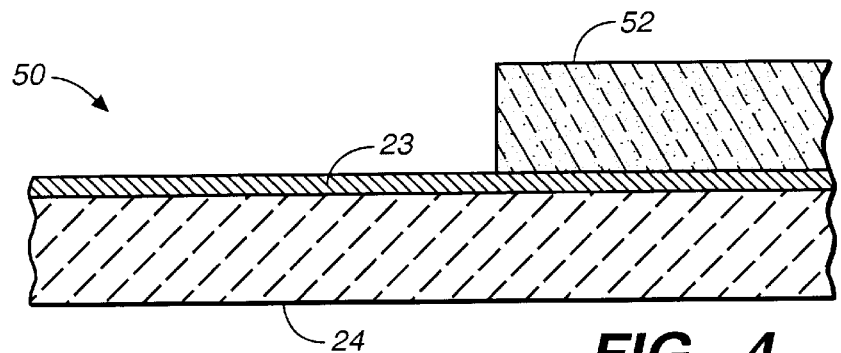
FIG._4
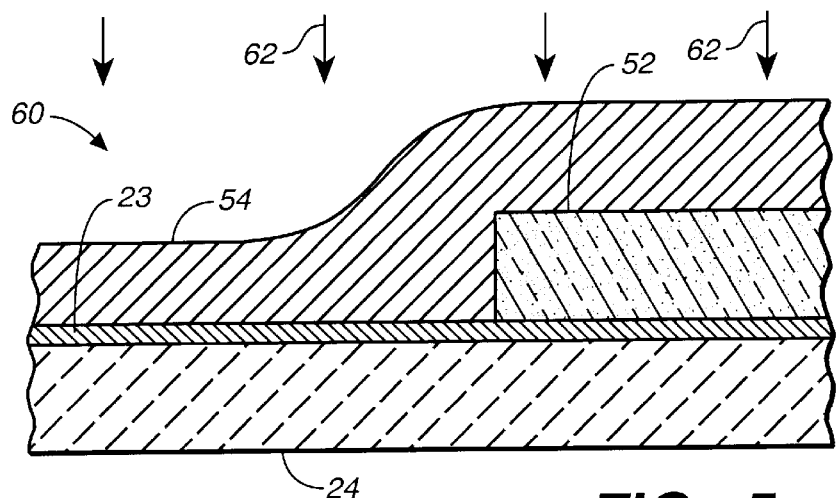
FIG._5
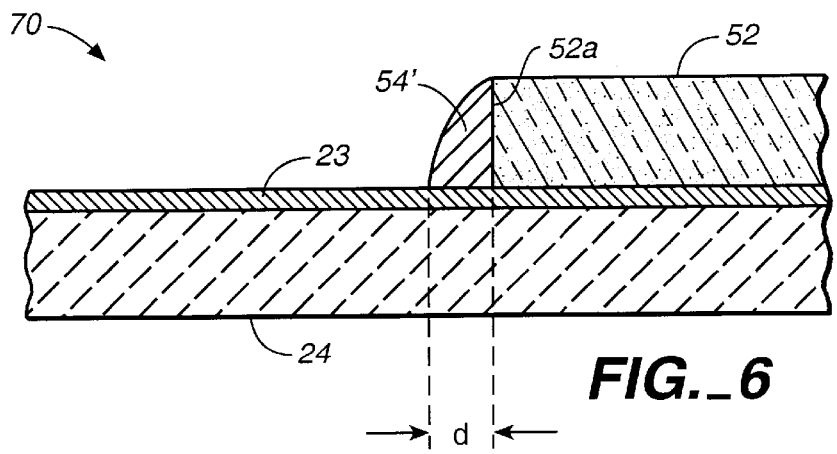
FIG._6

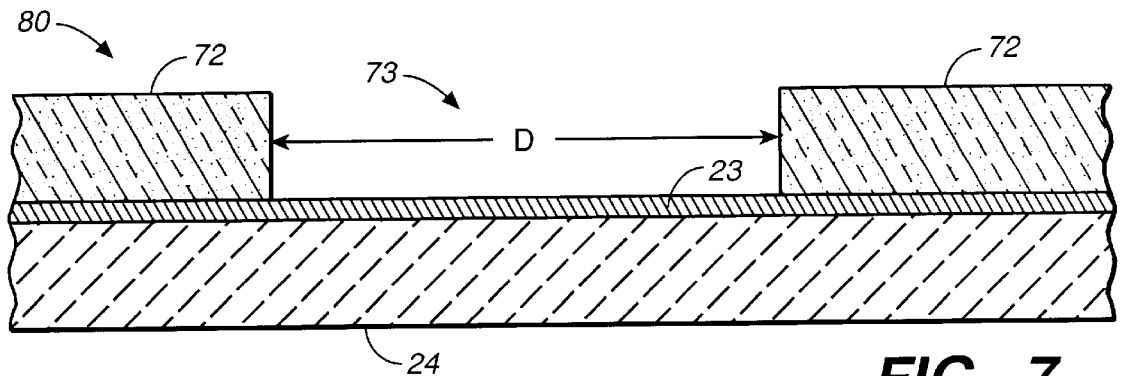
FIG._7
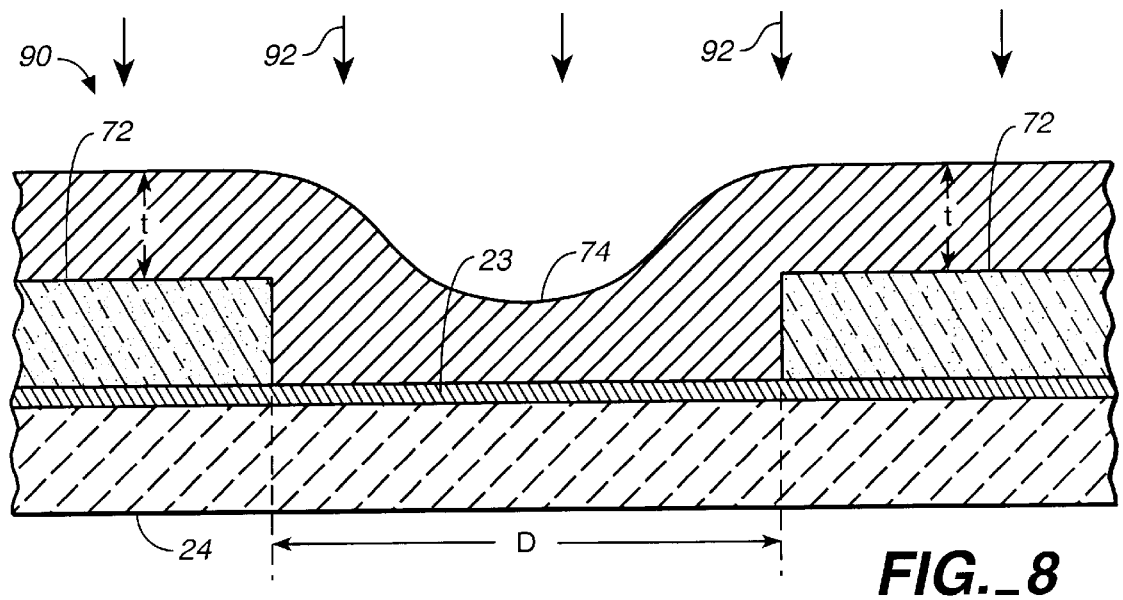
FIG._8
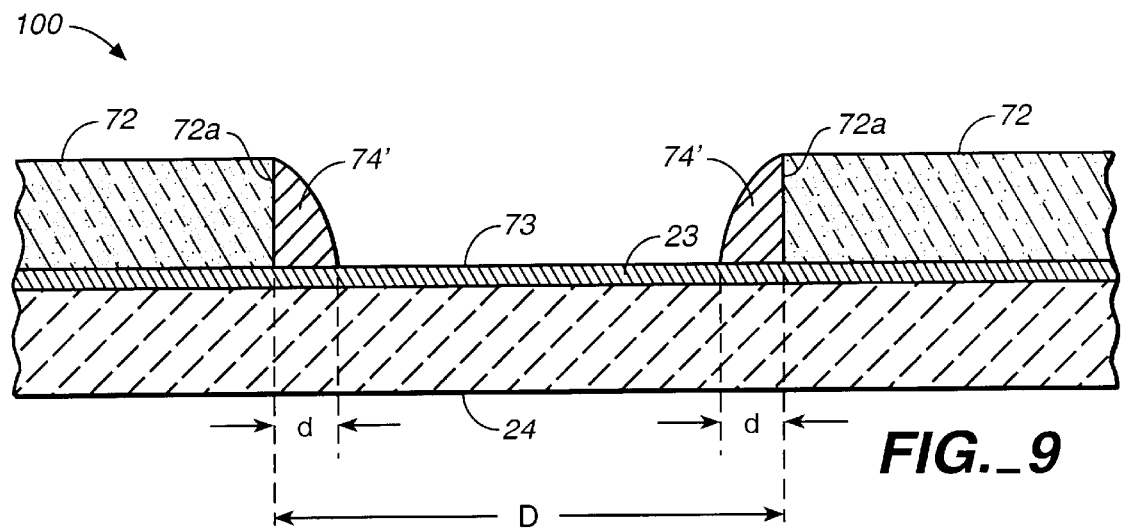
FIG._9

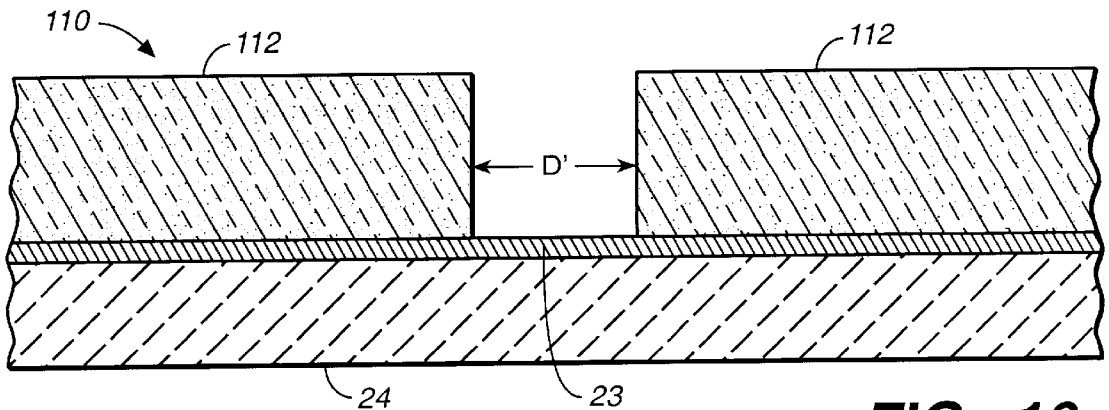
FIG._10
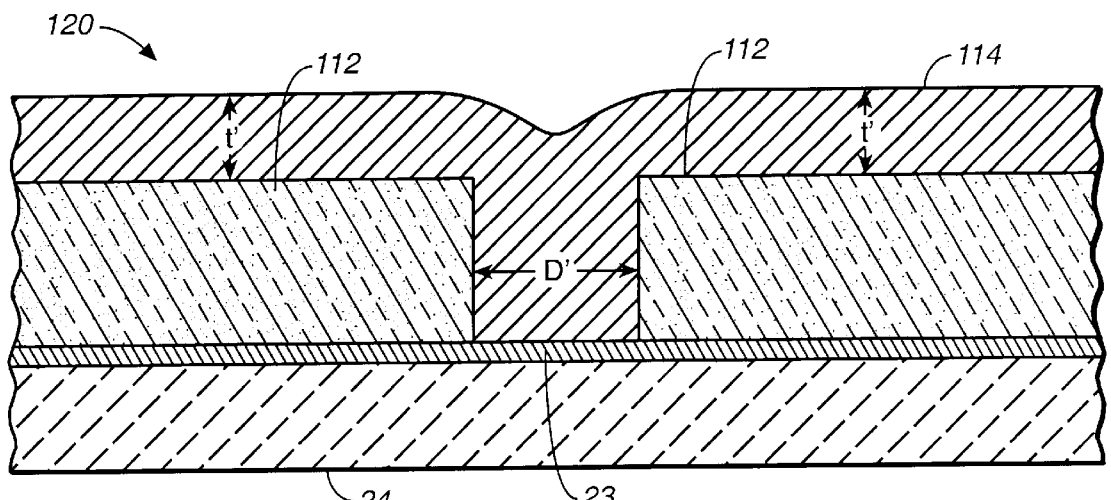
FIG._11
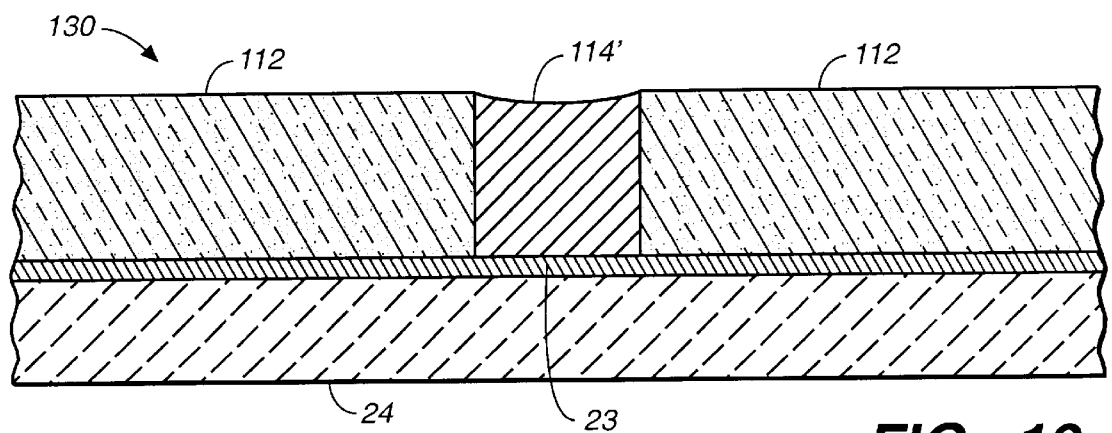
FIG._12

5,939,791

ELECTRICALLY CONDUCTIVE INTERCONNECTS FOR INTEGRATED CIRCUITS

BACKGROUND OF THE INVENTION

This invention relates in general to integrated circuits and in particular to an electrically conductive interconnect system for integrated circuits.

With the continual reduction in size of integrated circuits, each component within each circuit is likewise reduced in size. Not only are components such as transistors reduced in size, but also electrically conductive interconnect lines used in integrated circuits, as well as the spacing between these interconnect lines. Such line and spacing definitions can have submicron dimensions.

One equipment commonly used in integrated circuit manufacturing and related to line and spacing definition is a photostepper. A photostepper is used to expose a layer of resist disposed over a semiconductor wafer to electromagnetic radiation spatially modulated with a circuit pattern. The photostepper projects an image of the circuit pattern towards the wafer by means of a reticle or mask. The lower limit of the width of interconnect lines and the spacing between these lines are set by the resolution of the photostepper. Even when the most up-to-date photostepper equipment is used, it is still not possible to manufacture ultra narrow interconnect lines of line width or spacing width of the order of 0.1 micron.

It is therefore desirable to provide a system that can be used to manufacture integrated circuits with interconnect lines of the order of 0.1 micron or less.

SUMMARY OF THE INVENTION

This invention is based on the observation that finer interconnect lines can be achieved by avoiding photolithography and taking advantage of other semiconductor processing technologies, so that the width of interconnect lines are not limited by the resolution of the photostepper.

One aspect of the invention is directed towards a method for forming an electrically conductive line on a surface of a semiconductor material, comprising the steps of providing a semiconductor material with a surface having a step portion; forming a layer of an electrically conductive material over said surface; and removing said electrically conductive material but leaving at least one line of said electrically conductive material at the step portion.

Another aspect of the invention is directed towards a body of semiconductor material, comprising a semiconductor substrate, a dielectric layer on said substrate, said layer and the substrate forming a surface having at least one step portion; and a line of electrically conductive material at the at least one step portion, said line having a width of not more than 0.5 micron.

BRIEF DESCRIPTION OF THE DRAWINGS

FIG. 1 is a cross-sectional view of a body of semiconductor material prior to the formation of one or more interconnect lines to illustrate the invention.

FIG. 2 is a cross-sectional view of the body of semiconductor material of FIG. 1 after a layer of metal has been formed on top of it.

FIG. 3 is a cross-sectional view of the structure of FIG. 2 but after most of the metal interconnect material has been removed leaving four narrow lines of such material to serve as interconnect lines.

FIG. 4 is a cross-sectional view of a body of semiconductor material having a step portion useful for illustrating the invention.

FIG. 5 is a cross-sectional view of the structure of FIG. 4 after a layer of interconnect metal has been deposited thereon.

FIG. 6 is a cross-sectional view of the structure of FIG. 5 after most of the interconnect metal has been etched away leaving a line of the material at the step portion.

FIG. 7 is a cross-sectional view of a body of semiconductor material defining a trench on a surface.

FIG. 8 is a cross-sectional view of the structure of FIG. 7 after a layer of interconnect metal has been deposited thereon.

FIG. 9 is a cross-sectional view of the structure of FIG. 8 after most of the interconnect metal has been etched away leaving two lines of the metal at the two sides of the trench.

FIG. 10 is a cross-sectional view of a body of semiconductor material defining a trench and its surface.

FIG. 11 is a cross-sectional view of the structure of FIG. 10 after a layer of interconnect metal has been deposited thereon to fill the trench.

FIG. 12 is a cross-sectional view of the structure of FIG. 11 after the metal outside the trench has been etched away leaving a line of the metal in the trench.

For simplicity in description, identical components are labeled by the same numerals in this application.

DETAILED DESCRIPTION OF THE PREFERRED EMBODIMENT

FIG. 1 is a cross-sectional view of a semiconductor material with four sharp transitions or steps in the thickness of the material useful for illustrating the invention. In the preferred embodiment, the structure 20 of FIG. 1 can be formed by forming two platforms 22 of dielectric material on top of a substrate 24. Preferably, a layer 23 of a dielectric material such as silicon dioxide or silicon nitride is first deposited on a substrate such as a silicon (or other semiconductor material such as gallium arsenide) substrate. The function of this layer 23 is to shield the electrically conductive line to be formed from the substrate 24. Then another layer of a different dielectric material such as silicon dioxide or silicon nitride is first deposited on layer 23 for forming the platforms 22. A photoresist pattern is then formed on top of such dielectric layer, to shield portions of the layer and the unshielded portions of the dielectric layer are then etched anisotropically, and removing about the same thickness of the dielectric layer as originally deposited. The photoresist is then stripped thereafter, leaving the two platforms 22 of the dielectric material on top of the first shielding dielectric layer 23 as shown in FIG. 1.

Alternatively, the platforms 22 may comprise a single piece of dielectric material with the dielectric layer 23. In such event, a thicker dielectric layer is first deposited, and the above-described masking and etching step performed to a controlled depth to leave the platforms 22 as well as a shielding layer 23. Such and other methods for providing a semiconductor body with one or more step portions may be used and are within the scope of the invention. The same is true for the structures in FIGS. 4, 7, 10.

Then a layer of electrically conductive material, such as a metal (e.g., Tungsten) is deposited onto the structure 20 to form the structure 30 as shown in FIG. 2. The interconnect metal layer 26 may be formed by any of the known processes, such as conformal deposition of CVD metal.

Structure 30 is then anisotropically etched along arrows 32 to remove substantially the same thickness of the metal layer 26 as originally deposited. It will be noted that the portions 26a, 26b, 26c, 26d of the interconnect metal adjacent to the sidewalls 22a of the platforms 22 are thicker than the other portions of the metal layer that are spaced apart from the platforms. Since the etching process is anisotropic along arrows 32, a small portion 26' of the interconnect metal will be left covering each of the four sidewalls 22a of the two platforms as shown in FIG. 3. Thus if the two dielectric platforms 22 are elongated structures, the metal sidewalls 26' will form four separate thin interconnect lines on substrate 24. The width of the four lines 26' is defined as the cross-sectional dimensions of the lines in directions parallel to the surface of the substrate 24. Thus as shown in FIG. 3, the width of the lines 26' is shown as d.

Since no photostepper is involved in the above-described process, the line width d is determined only by the thickness of the platforms 22 and the thickness of the metal layer 26. Using the above-described process, it is possible to manufacture interconnect lines 26' that are smaller than 0.5 micron or 0.1 micron. The line width can be almost arbitrarily small, even as small as 100 Angstroms (0.01 micron). It is of course possible to manufacture interconnect lines using this method that are much wider, but for practical integrated circuit applications, d would be at most about 3 microns. In many applications, the interconnect line width may be in the range of 0.01 to 1 micron.

FIG. 4 is a cross-sectional view of a semiconductor body useful for illustrating an alternative embodiment of the invention. The semiconductor body of FIG. 4 comprises a substrate 24, a dielectric layer 23 and a layer of dielectric material 52 deposited on top of layer 23 using one of the processes described or referred to above. Again dielectric layer 23 may alternatively comprise a single material with the layer a portion of which is etched away to form the step portion 52. A layer of interconnect metal 54 is deposited again by a known process such as conformal CVD deposition to form structure 60. Structure 60 is subjected to anisotropic etching in a known process along arrows 62 to remove substantially the same thickness of interconnect metal as that deposited. For the same reasons as those explained above for FIGS. 1–3, a small portion 54' of the interconnect metal layer will be left covering the sidewall 52a of the step portion 52'. If the sidewall 52a is elongated, portion 54' will form an elongated interconnect line on substrate 24. Again the line width d is not subject to the resolution of any photosteppers and can be arbitrarily small.

FIG. 7 is a cross-sectional view of a semiconductor body 80 comprising a substrate 24, dielectric layer 23 and a layer 72 of dielectric material formed in a manner described above for FIGS. 1 and 4. As seen in FIG. 7, body 80 defines a trench 73 therein between two adjacent portions of layer 72. A layer of interconnect metal 74 is then deposited on top of structure 80 to form structure 90 of FIG. 8. Structure 90 is subjected to anisotropic etching along arrows 92. The etching process removes about the same thickness of the interconnect metal as originally deposited, leaving two small portions 74' of the metal covering the sidewalls 72a of the dielectric layer. Again the line width d is not subject to the limitation of photostepper resolution. From FIGS. 8 and 9, it will be seen that the width D of the trench 73 is greater than twice the thickness t of the interconnect metal layer 74 in FIG. 8. When this is the case, after the etching process, the two portions 74' covering the two sidewalls 72a of the trench 73 will be spaced apart forming two separate interconnect lines rather than a single line. By choosing an appropriate value for D, t and the thickness of layer 72, the spacing between the two interconnect lines of FIG. 9 can also be arbitrarily small. In many applications, the spacing may be in the range of 0.01 to 1 micron.

FIGS. 10–12 illustrate the situation where the width D' of the trench is smaller than twice the thickness t' of the interconnect metal layer so that only a single interconnect line results. Thus the structures 110, 120, 130 differ from structures 80, 90 and 100 respectively in that the width D' of structures 110, 120, 130 is smaller than twice the thickness t' of the interconnect metal layer 114 so that a single interconnect line 114' results. The etching process applied to structure 120 may be anisotropic or isotropic; in this aspect, the process of FIGS. 10–12 is different from those of FIGS. 1–9. The width of line 114' is determined by the width of trench D', which can be arbitrarily small.

While the invention has been described above by reference to various embodiments, it will be understood that different changes and modifications may be made without departing from the scope of the invention which is to be determined only according to the appended claims. For example, even though metal is used as the interconnect material, other electrically conductive interconnect material may also be used, such as doped polysilicon. Also, while the figures and description describe the dielectric layer 22, 52, 72, 112 as being left in place after the interconnect lines have been formed, it will be understood that they can be removed after the line formation if desired, such as by dipping the structure in a bath of dilute hydrofluoric acid or by etching in a manner known to those skilled in the art.

What is claimed is:

1. A body of semiconductor material, comprising:
   a semiconductor substrate;
   a dielectric layer on said substrate, said layer and the substrate forming a surface having at least one step portion; and
   an elongated interconnect line of electrically conductive material at the at least one step portion, said interconnect line having a width of not more than 0.5 micron.

2. The apparatus of claim 1, said layer being in the shape of a raised elongated platform, said platform defined by two elongated step portions, said apparatus comprising two lines of said electrically conductive material at the two elongated step portions.

3. The apparatus of claim 1, said apparatus having two elongated step portions separated by an elongated trench.

4. The apparatus of claim 3, said trench having a width, said electrically conductive material having a thickness less than half the width of said trench.

5. The apparatus of claim 3, said trench having a width, said layer of electrically conductive material having a thickness greater than half the width of said trench and fills the trench.

6. The apparatus of claim 1, wherein said line is less than 0.1 micron thick.

7. The apparatus of claim 1, said line comprising a metal.

8. The apparatus of claim 1, said line having a width of between 0.1 and 0.5 micron.

9. The apparatus of claim 1, said line having a width of not more than 0.1 micron.

10. An integrated circuit comprising:
    a substrate;
    layers on the substrate, the layers including a dielectric layer, the layers including at least one dielectric step portion; and
    an interconnect line of electrically conductive material contacting the dielectric layer and the at least one step portion, said interconnect line having a width of not more than 0.5 micron, the interconnect line arranged to electrically connect circuit elements on the integrated circuit.

11. The integrated circuit of claim 10, said circuit including two elongated dielectric step portions and two lines of said electrically conductive material at the two elongated step portions.

12. The integrated circuit of claim 10, including two elongated dielectric step portions separated by an elongated trench.

13. The integrated circuit of claim 12, said trench having a width, said electrically conductive material having a thickness less than half the width of said trench.

14. The integrated circuit of claim 12, said trench having a width, said layer of electrically conductive material having a thickness greater than half the width of said trench and fills the trench.

15. The integrated circuit of claim 10, wherein said line is less than 0.1 micron thick.

16. The integrated circuit of claim 10, wherein the step portion forms a part of the dielectric layer.

17. The integrated circuit of claim 10, said line comprising a metal.

18. The apparatus of claim 10, said line having a width of between 0.1 and 0.5 micron.

19. The apparatus of claim 10, said line having a width of not more than 0.1 micron.

* * * * *